United States Patent
Yang et al.

(10) Patent No.: US 9,564,193 B2
(45) Date of Patent: Feb. 7, 2017

(54) CIRCUIT TO GENERATE A SENSE AMPLIFIER ENABLE SIGNAL

(71) Applicant: TAIWAN SEMICONDUCTOR MANUFACTURING COMPANY, LTD., Hsinchu (TW)

(72) Inventors: Jung-Ping Yang, Jui-bei (TW); Chih-Chieh Chiu, Hsinchu (TW); Fu-An Wu, Hsinchu (TW); Chia-En Huang, Xinfeng Township (TW); I-Han Huang, Tainan (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/039,340

(22) Filed: Sep. 27, 2013

(65) Prior Publication Data
US 2015/0092502 A1    Apr. 2, 2015

(51) Int. Cl.
| | |
|---|---|
| *G11C 7/06* | (2006.01) |
| *G11C 7/12* | (2006.01) |
| *G11C 7/22* | (2006.01) |
| *G11C 7/08* | (2006.01) |
| *G11C 11/419* | (2006.01) |

(52) U.S. Cl.
CPC .................. *G11C 7/227* (2013.01); *G11C 7/08* (2013.01); *G11C 11/419* (2013.01); *G11C 7/12* (2013.01)

(58) Field of Classification Search
CPC ............... G11C 7/06; G11C 7/22; G11C 7/12; G11C 8/08; G11C 11/412
USPC ................. 365/196, 194, 203, 204, 154, 156
See application file for complete search history.

(56) References Cited

U.S. PATENT DOCUMENTS

| | | | | |
|---|---|---|---|---|
| 6,738,296 | B2 * | 5/2004 | Sung et al. | 365/189.07 |
| 7,755,964 | B2 * | 7/2010 | Jung et al. | 365/210.1 |
| 7,859,920 | B2 * | 12/2010 | Jung | G11C 7/08 365/189.15 |
| 8,467,257 | B1 * | 6/2013 | Liu et al. | 365/196 |

* cited by examiner

*Primary Examiner* — Hoai V Ho
*Assistant Examiner* — Tri Hoang
(74) *Attorney, Agent, or Firm* — Hauptman Ham, LLP

(57) ABSTRACT

A circuit includes a tracking bit line, a tracking unit connected to the tracking bit line and a detection unit. The tracking unit is configured to receive a first control signal and configured to selectively charge or discharge a voltage on the tracking bit line in response to the first control signal. The detection unit is coupled to the tracking bit line and configured to generate a sense amplifier enable (SAE) signal in response to the voltage level on the tracking bit line.

20 Claims, 7 Drawing Sheets

CIRCUIT TO GENERATE A SENSE AMPLIFIER ENABLE SIGNAL

BACKGROUND

As Integrated Circuits (IC) have become smaller and more complex, transistors can become more sensitive to gate delays due to perimeter variations and reduced supply voltages. The yield of low voltage digital circuits is sensitive to local gate delay variations due to uncorrelated intra-die parameter deviations. Parameter deviations can be caused by statistical deviations of the doping concentration within the semiconductor device that lead to more pronounced delay variations for minimum transistor sizes. The path delay variations increase for smaller device dimensions and reduced supply voltages affecting IC performance.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

Figure 1A:
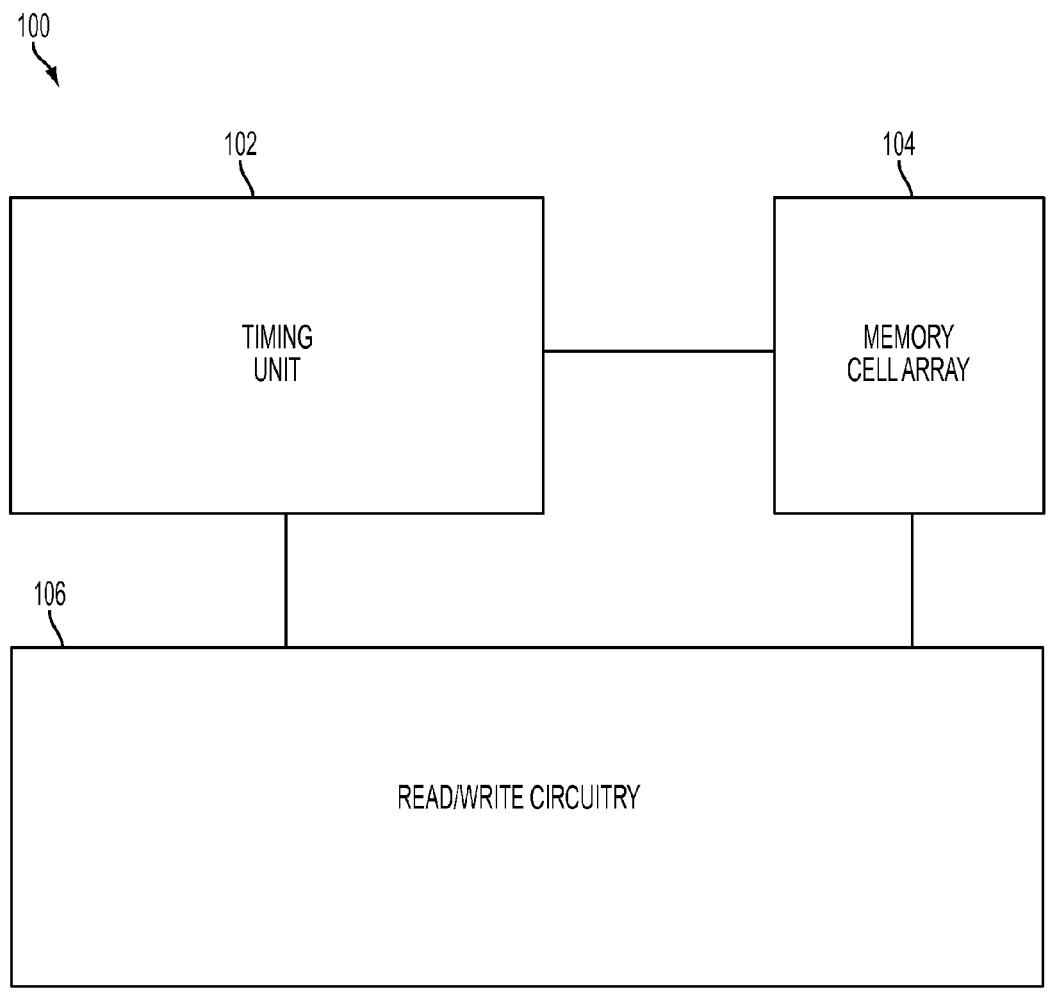
FIG. 1A is a block diagram in accordance with one or more embodiments.

The following disclosure provides many different embodiments, or examples, for implementing different features of the disclosed subject matter. Specific examples of components and arrangements are described below to simplify the present disclosure. These are examples and are not intended to be limiting.

This description of the various embodiments is intended to be read in connection with the accompanying drawings, which are to be considered part of the entire written description. In the description, relative terms such as "before," "after," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the system be constructed or operated in a particular orientation. Terms concerning attachments, coupling and the like, such as "connected" and "interconnected," refer to a relationship wherein components are attached to one another either directly or indirectly through intervening components, unless expressly described otherwise.

FIG. 1A is a block diagram of a static random-access memory (SRAM) circuit 100 in accordance with an embodiment. SRAM circuit 100 includes a timing unit 102, memory cell array 104 and read/write circuitry 106. Memory cell array 104 is coupled to read/write circuitry 106 and timing unit 102. Read/write circuitry 106 is also coupled to timing unit 102. The memory cell array 104 stores data accessible by read/write circuitry 106. The timing unit 102 controls the timing of read/write circuitry 106.

Figure 1B:
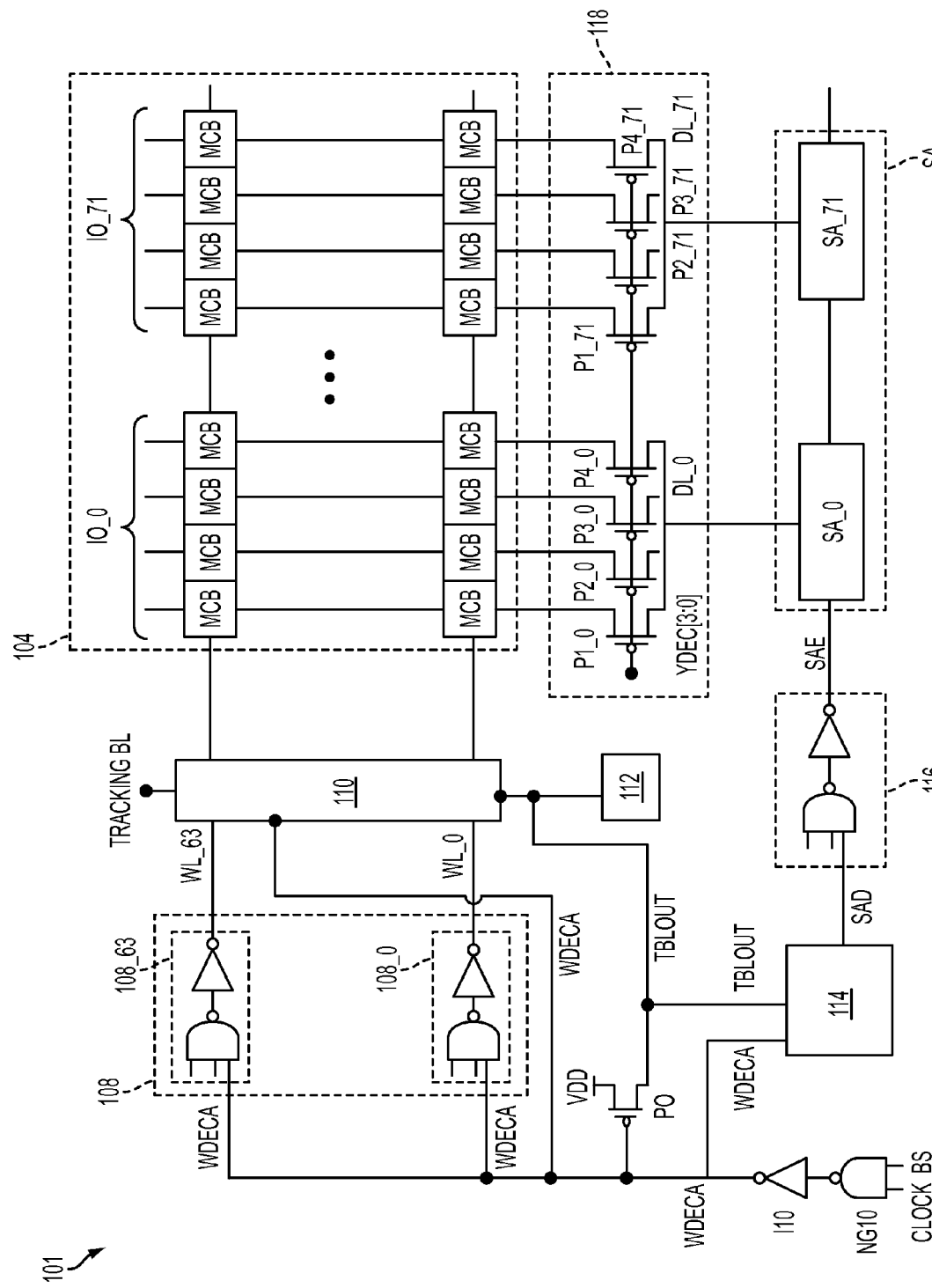
FIG. 1B is a schematic diagram in accordance with one or more embodiments.

FIG. 1B is a schematic diagram of a circuit 101 in accordance with an embodiment. Circuit 101 is an embodiment of circuit 100 in FIG. 1A. In one or more embodiments, the timing unit 102 of FIG. 1A comprises a tracking unit 110, capacitance unit 112 and detection unit 114 (shown in FIG. 1B). In one or more embodiments, detection unit 114 includes a voltage detection unit. In one or more embodiments, the read/write circuitry 106 of FIG. 1A comprises a word line driver 108, sense amplifier driver 116, sense amplifier SA and address decoder 118 (shown in FIG. 1B).

Circuit 101 includes NAND gate NG10, inverter I10, a p-type Metal-Oxide Semiconductor Field Effect (PMOS) transistor P0, word line driver 108, tracking unit 110, capacitance unit 112, detection unit 114, sense amplifier driver 116, sense amplifier SA and memory cell array 104.

NAND gate NG10 is configured to receive a bank select signal BS. The bank select signal BS is e.g., a low logical value or a high logical value. NAND gate NG 10 is connected to an inverter I10. NAND gate NG10 includes two inputs; one of the inputs is connected to the bank select signal BS and the other input is connected to a clock signal.

Inverter I10 is connected to NAND gate NG10, PMOS transistor P0, word line driver 108 and tracking unit 110. Inverter I10 is configured to invert the signal received from the NAND gate NG10 resulting in control signal WDECA.

The gate of PMOS transistor P0 is connected to Inverter I10 and is configured to receive control signal WDECA. The source of PMOS transistor P0 is connected to voltage source VDD. The drain of PMOS transistor P0 is connected to tracking bit line TBL (which is connected to tracking unit 110, capacitance unit 112 and detection unit 114). In some embodiments, PMOS transistor P0 functions as a switch triggered by received control signal WDECA. For example, when the control signal WDECA is a low logical value, the PMOS transistor P0 is in an ON state and the voltage on the tracking bit line TBL is at a high logical value. For example, when the control signal WDECA is a high logical value, the PMOS transistor P0 is in an OFF state and the voltage on the tracking bit line TBL discharges from a high logical value to a low logical value. In some embodiments, transistor P0 is an NMOS transistor or any other equivalent circuit that functions as a switch device.

Word line driver 108 is connected to inverter I10, the gate of transistor P0 and to memory cell array 104. Word line driver 108 includes word line drivers 108_0, . . . , 108_63. Each of the word line drivers 108_0, . . . , 108_63 is configured to receive control signal WDECA from inverter I10. Each of word line drivers 108_0, . . . , 108_63 generates a word line signal WL_0, . . . , WL_63 to memory cell array 104. Word line drivers 108_0, . . . , 108_63 include a three input NAND gate (not labeled) and an inverter (not labeled). Each NAND gate and each inverter in word line drivers 108_0, . . . , 108_63 have a time delay. In some embodiments, the size of the word line drivers 108, NAND gates and inverters are varied.

Tracking unit 110 is connected to word line driver 108 and is connected to the capacitance unit 112, the drain of PMOS transistor P0 and detection unit 114 by the tracking bit line TBL. Tracking unit 110 is configured to receive control signal WDECA. Tracking unit 110 generates a tracking bit line signal TBLOUT based on at least control signal WDECA. Tracking unit 110 performs a voltage charge/discharge of the tracking bit line TBL in response to at least control signal WDECA. In one or more embodiments, the rate of discharge of the tracking bit line TBL is varied.

Capacitance unit 112 is connected to the drain of PMOS transistor P0 and detection unit 114 by the tracking bit line TBL. Memory cell conditions are modeled by adding capacitive loads (i.e., capacitance unit 112) to the tracking bit lines and data lines. Capacitance unit 112 has an equivalent total capacitance $C_T$ of the total equivalent capacitance of the Data Line (DL (shown in FIG. 1B as DL_0, . . . , DL_71)), total equivalent capacitance of the Back End (BE) of line and the total capacitance of the Front End (FE) of line. In one or more embodiments, capacitance unit 112 includes a capacitance matching unit which improves process gradient performance. In one or more embodiments, when the control signal WDECA is a low logical value, capacitance unit 112 receives voltage signal TBLOUT from the tracking bit line TBL and stores the voltage signal TBLOUT. In one or more embodiments, when the control signal WDECA is a high logical value, capacitance unit 112 discharges the stored voltage signal TBLOUT to the tracking bit line TBL.

Detection unit 114 is connected to the drain of PMOS transistor P0, capacitance unit 112 and tracking unit 110 by the tracking bit line TBL. Detection unit 114 is also connected to the sense amplifier driver 116. Detection unit 114 is configured to detect the change in the signal TBLOUT on the tracking bit line TBL, and is configured to output detection signal SAD to sense amplifier driver 116. In one or more embodiments, detection unit 114 detects the change in the voltage signal TBLOUT on the tracking bit line TBL, and outputs signal SAD (a low or high logical value). In one or more embodiments, detection unit 114 indirectly triggers a sense amplify enable (SAE) signal.

The sense amplifier driver 116 is connected to the output of the detection unit 114 and the input of the sense amplifier SA. The sense amplifier driver 116 is configured to receive signal SAD from the detection unit 114. In some embodiments, signal SAD is a low or high logical value. The sense amplifier driver 116 is configured to generate the SAE signal which controls the operation of the sense amplifier SA. The sense amplifier driver 116 includes a three-input NAND gate (not labeled) connected in series to an inverter (not labeled); one of the inputs to the NAND gate is connected to the output of the detection unit 114 and the other two inputs to the NAND gate are connected to a high or low logical value. In some embodiments, the detection unit 114 detects a voltage change of signal TBLOUT on the tracking bit line TBL and outputs a high logical value to the NAND gate; the other two inputs of the NAND gate are also connected to a high logical value, and the NAND gate outputs a low logical value input to an inverter. In this example, the inverter inverts the low logical value signal resulting in a high logical value signal for the SAE signal.

The sense amplifier SA is connected to the sense amplifier driver 116 and the memory cell array 104. The sense amplifier SA includes a plurality of sense amplifiers SA_0, . . . , SA_71. In one or more embodiments, the sense amplifier SA is one or more sense amplifiers. The sense amplifier SA is configured to receive the SAE signal from the sense amplifier driver 116. Upon receipt of the SAE signal, the sense amplifier SA reads data contained in the memory cell array 104. In some embodiments, the sense amplifier SA refreshes data contained in the memory cell array 104. In some embodiments, a received SAE signal with a high logical value results in the sense amplifier to perform a read operation of memory cell array 104. In some embodiments, the SAE signal includes a read timing signal generated by the tracking unit 110 based on capacitance unit 112.

Address decoders 118 are connected to the sense amplifiers SA by data lines DL_0, . . . , DL_71. Address decoders 118 are also connected to memory cell array 104. Address decoders 118 provide the Y- or column-address of memory cell array 104 to be accessed for a read or a write operation. For example, address decoders 118 determine the corresponding read word line of each accessed individual memory cell block (MCB) to be turned on based on the address of the accessed MCB.

Address decoders 118 are divided into a series of sections, each section includes a plurality of transistors connected to memory cell array 104. Each section of address decoder 118 includes a corresponding Data Line DL connected to a corresponding sense amplifier SA. The source of each of the PMOS transistors P1_0, P2_0, P3_0 and P4_0 is connected to each individual MCB. The gate of each of the PMOS transistors P1_0, P2_0, P3_0 and P4_0 is connected to the Ydecoded address decoder YDEC[3:0]. The drain of each of the PMOS transistors P1_0, P2_0, P3_0 and P4_0 is connected to the data line DL_0. Each of the transistors of the address decoder 118 is connected to the MCB in a similar manner as that shown for PMOS transistors P1_0, P2_0, P3_0 and P4_0. Similarly, the source of each of the PMOS transistors P1_71, P2_71, P3_71 and P4_71 is connected to each individual MCB; the gate of each of the PMOS transistors P1_71, P2_71, P3_71 and P4_71 is connected to the Ydecoded address decoder YDEC[3:0]; and the drain of each of the PMOS transistors P1_71, P2_71, P3_71 and P4_71 is connected to the data line DL_71. In some embodiments, address decoders 118 include a plurality of NMOS transistors or a combination of NMOS and PMOS transistors. In some embodiments, memory cell array 104 has one or more MCB storage cells, where each MCB storage cell is connected to a corresponding PMOS/NMOS transistor.

Memory cell array 104 is connected to external circuits by Input/Output (IO) connections IO_0 and IO_71 for read operations. Memory cell array 104 includes a plurality of MCB storage cells which store each bit of data. The plurality of MCB storage cells are arranged in a grid and connected to address decoders 118 and word line drivers 108_0, . . . , 108_63. In read operations, each bit of data in the memory cell array 104 is read from an individual MCB storage cell. In write operations, each bit of data in the memory cell array 104 is stored in an individual MCB storage cell. In some embodiments, each memory cell block (MCB) in the memory cell array 104 includes cross-coupled inverters (not shown) which provide two stable voltage states which are used to denote low and high logic values "0" and "1". In some embodiments, the memory cell array 104 includes a plurality of MOSFETs to store datum of each memory bit. In some embodiments, fewer transistors utilized per storage cell results in a smaller occupied area by each MCB storage cell.

Figure 2:
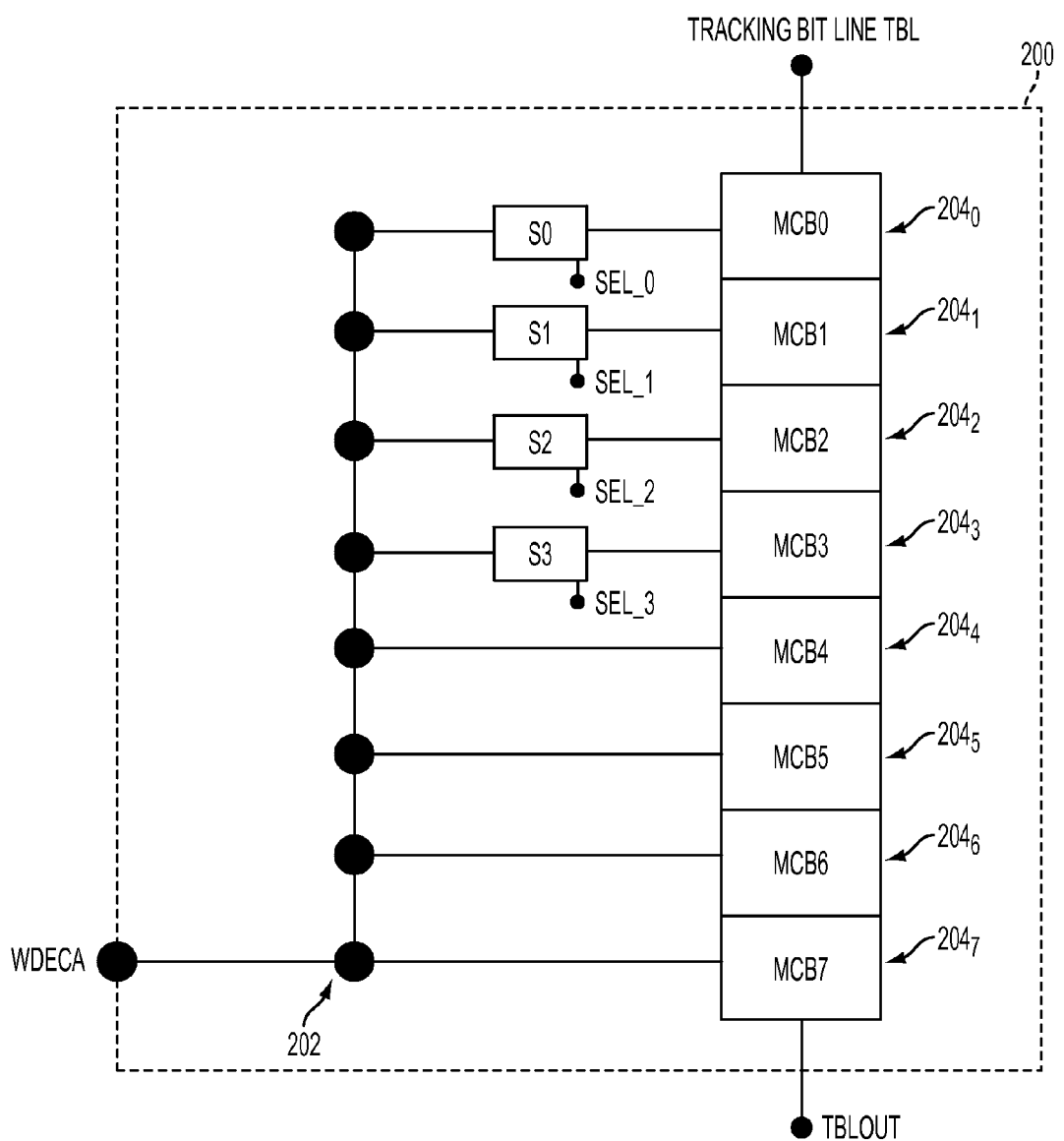
FIG. 2 is a schematic diagram of a tracking unit in accordance with one or more embodiments.

FIG. 2 is a schematic diagram of a tracking unit 200 in accordance with one or more embodiments. Tracking unit 200 is an embodiment of tracking unit 110 shown in FIG. 1B. Tracking unit 200 includes input node 202, switch elements S0, S1, S2 and S3, memory cell blocks $204_0, \ldots, 204_7$ and tracking bit line TBL. Tracking unit 200 performs a voltage charge/discharge of the tracking bit line TBL in response to at least control signal WDECA or control signal from switch elements S0, S1, S2 and S3. In one or more embodiments, when control signal WDECA changes from a low voltage level to a high voltage level, tracking unit 200 performs a voltage discharge of the tracking bit line TBL from a high voltage level to a low voltage level. In one or more embodiments, control signals from switch elements S0, S1, S2 and S3 controls the rate of voltage discharge, performed by the tracking unit 200, of the tracking bit line TBL from a high voltage level to a low voltage level. In one or more embodiments, the high voltage level is approximately the source voltage VDD.

Tracking unit 200 is configured to receive control signal WDECA from inverter I10. Tracking unit 200 is configured to output a signal TBLOUT on the tracking bit line TBL. In one or more embodiments, signal TBLOUT is a voltage signal that ranges from a low logical value to a high logical value and varies with time (shown in FIG. 5).

Switch element S0 is connected to input node 202 and memory cell block $204_0$. Switch element S1 is connected to input node 202 and memory cell block $204_1$. Switch element S2 is connected to input node 202 and memory cell block $204_2$. Switch element S3 is connected to input node 202 and memory cell block $204_3$. In one or more embodiments, switch elements S0, S1, S2 and S3 include PMOS transistors, NMOS transistors and a transmission gate. In one or more embodiments, the number of switch elements corresponds to the number of memory cell blocks (MCB). In one or more embodiments, the number of switch elements is less than the number of memory cell blocks (MCB). In one or more embodiments, the number of switch elements is one or more. In one or more embodiments, the number of switch elements is 32. Switch elements S0, S1, S2 and S3 control the amount of driving current $I_{CELL}$ in the memory cell blocks $204_0, \ldots, 204_7$ and controls the timing delay $\tau$ introduced by the tracking unit 200. In one or more embodiments, the amount of driving current $I_{CELL}$ in the memory cell blocks $204_0, \ldots, 204_7$ is inversely proportional to the timing delay $\tau$ introduced by the tracking unit 200.

Switch element S0 is configured to receive control signal WDECA from input node 202. Switch element S0 is configured to receive control select signal SEL_0. In one or more embodiments, the number of received signals (WDECA and SEL_0) is greater than one and includes a corresponding differential control select signal. The amount of driving current $I_{CELL}$ in the memory cell block $204_0$ is controlled by the switch element S0 and the corresponding control select signal SEL_0. In one or more embodiments, a control select signal SEL_0 will turn on switch element S0, allowing the memory cell block $204_0$ to discharge current $I_{CELL}$ on the tracking bit line TBL. In one or more embodiments, a control select signal SEL_0 will turn off switch element S0, preventing the memory cell block $204_0$ to discharge current $I_{CELL}$ on the tracking bit line TBL. The control select signal includes a low logical value or a high logical value.

Switch element S1 is configured to receive control signal WDECA from input node 202. Switch element S1 is configured to receive control select signal SEL_1. In one or more embodiments, the number of received signals (WDECA and SEL_1) is greater than one and includes a corresponding differential control select signal. The amount of driving current $I_{CELL}$ in the memory cell block $204_1$ is controlled by the switch element S1 and the corresponding control select signal SEL_1. In one or more embodiments, a control select signal SEL_1 will turn on switch element S1, allowing the memory cell block $204_1$ to discharge current $I_{CELL}$ on the tracking bit line TBL. In one or more embodiments, a control select signal SEL_1 will turn off switch element S1, preventing the memory cell block $204_1$ to discharge current $I_{CELL}$ on the tracking bit line TBL. The control select signal includes a low logical value or a high logical value.

Switch element S2 is configured to receive control signal WDECA from input node 202. Switch element S2 is configured to receive control select signal SEL_2. In one or more embodiments, the number of received signals (WDECA and SEL_2) is greater than one and includes a corresponding differential control select signal. The amount of driving current $I_{CELL}$ in the memory cell block $204_2$ is controlled by the switch element S2 and the corresponding control select signal SEL_2. In one or more embodiments, a control select signal SEL_2 will turn on switch element S2, allowing the memory cell block $204_2$ to discharge current $I_{CELL}$ on the tracking bit line TBL. In one or more embodiments, a control select signal SEL_2 will turn off switch element S2, preventing the memory cell block $204_2$ to discharge current $I_{CELL}$ on the tracking bit line TBL. The control select signal includes a low logical value or a high logical value.

Switch element S3 is configured to receive control signal WDECA from input node 202. Switch element S3 is configured to receive control select signal SEL_3. In one or more embodiments, the number of received signals (WDECA and SEL_3) is greater than one and includes a corresponding differential control select signal. The amount of driving current $I_{CELL}$ in the memory cell block $204_3$ is controlled by the switch element S3 and the corresponding control select signal SEL_3. In one or more embodiments, a control select signal SEL_3 will turn on switch element S3, allowing the memory cell block $204_3$ to discharge current $I_{CELL}$ on the tracking bit line TBL. In one or more embodiments, a control select signal SEL_3 will turn off switch element S3, preventing the memory cell block $204_3$ to discharge current $I_{CELL}$ on the tracking bit line TBL. The control select signal includes a low logical value or a high logical value.

Memory cell blocks $204_0, \ldots, 204_7$ are connected to the tracking bit line TBL, to the switch elements S0, S1, S2 and S3 and to input node 202. Memory cell blocks $204_0, \ldots, 204_7$ are arranged in a vertical grid where each previous memory cell block 204 is connected to the successive memory cell block along the tracking bit line TBL. Memory cell blocks $204_0, \ldots, 204_7$ have substantially the same configuration as the memory cell array 104 described with reference to FIG. 1B. Memory cell blocks $204_0, 204_1, 204_2$ and $204_3$ are each connected to corresponding switch elements S0, S1, S2 and S3. Memory cell blocks $204_4, 204_5, 204_6$ and $204_7$ include dummy memory cells. In one or more embodiments, the number of dummy memory cells includes any number of dummy memory cells.

Figure 3:
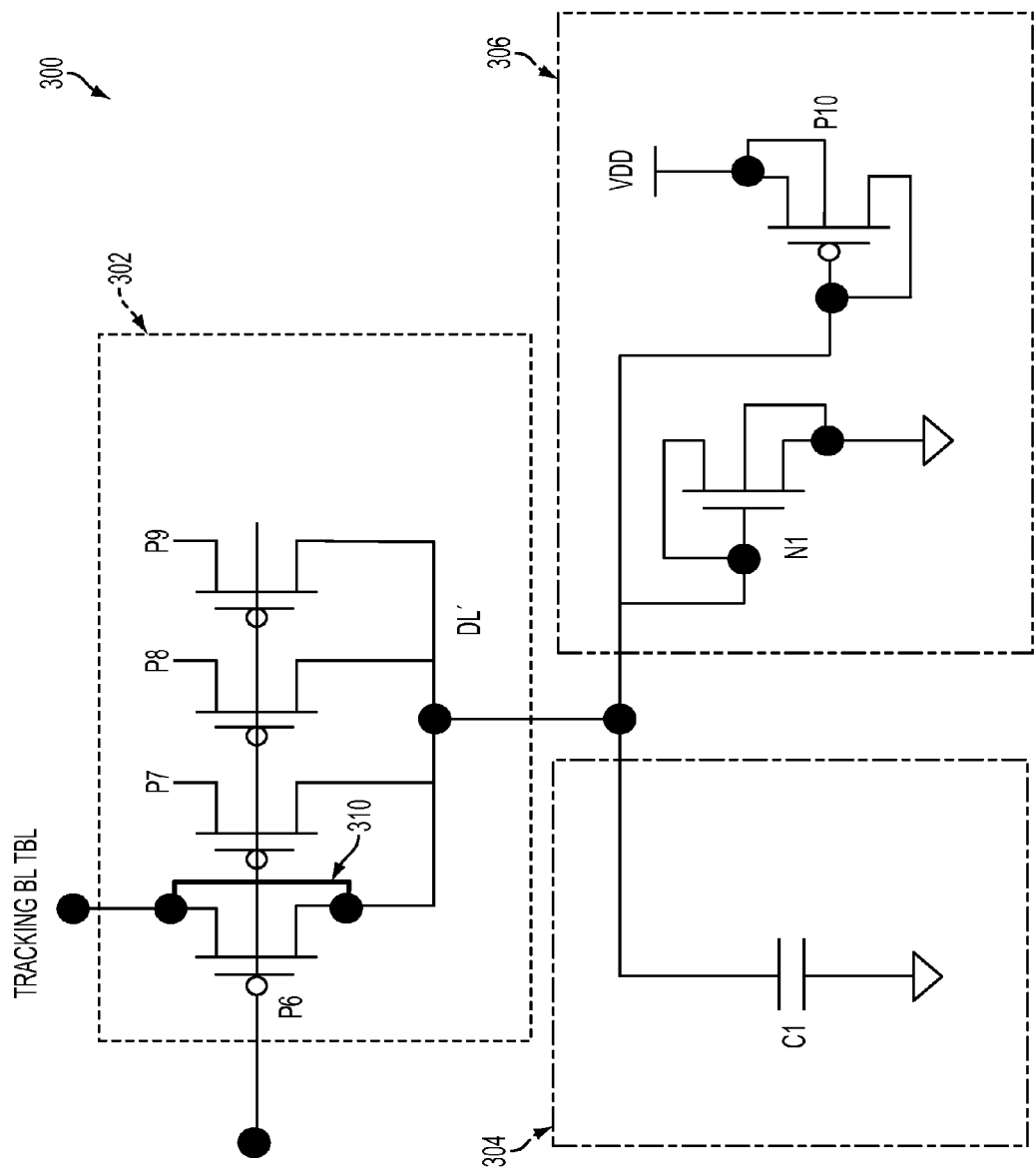
FIG. 3 is a schematic diagram of a capacitance unit in accordance with one or more embodiments.

FIG. 3 is a schematic diagram of a capacitance unit 300 in accordance with one or more embodiments. Capacitance unit 300 is an embodiment of capacitance unit 112 shown in FIG. 1B. Memory cell conditions are modeled by adding capacitive loads (i.e., capacitance unit 300) to the tracking bit lines and data lines. Capacitance unit 300 includes capacitance DL 302, capacitance BE 304 and capacitance FE 306. Capacitance unit 300 is an equivalent total capacitance $C_T$ of the equivalent capacitance of the data line (DL) 302, total equivalent capacitance of the back end (BE) of line 304 and the total capacitance of the front end (FE) of line 306. In some embodiments, capacitance unit 300 includes a capacitance matching unit which improves process gradient performance.

Capacitance DL 302 is an embodiment of one section of address decoders 118 previously shown in FIG. 1B. Capacitance DL 302 includes the capacitance of the Data Line (DL), which e.g., makes it possible to improve the tracking/timing of circuit 101. In one or more embodiments, the capacitance DL 302 includes the equivalent capacitance of the data line DL for each of the address decoders 118 previously shown in FIG. 1B. Capacitance DL 302 is connected to the tracking bit TBL illustrated in FIG. 2. Capacitance DL 302 includes PMOS transistors P6, P7, P8 and P9. The gate of each of the PMOS transistors P6, P7, P8 and P9 is connected to a low logical value or a high logical value. The source of PMOS transistor P6 is connected to the drain of PMOS transistor P6 by pass gate 310. Pass gate 310 is a short, which allows PMOS transistor P6 to operate at low operating voltage levels preventing an off state (high resistance state) of capacitance DL 302. For example, if capacitance DL 302 is in an off state (high resistance state), capacitance unit 300 is bypassed and the data line DL effects on the tracking bitline signal TBLOUT/read timing delay τ are not accurately modeled. The source of each of the PMOS transistors P7, P8 and P9 is floating. The drain of each of the PMOS transistors P6, P7, P8 and P9 is connected to capacitance BE 304 and capacitance FE 306 by Data Line DL'.

Capacitance BE 304 includes the total equivalent capacitance of the Back End (BE) of line of the circuit 101 shown in FIG. 1B. Capacitance BE 304 includes at least the equivalent capacitances of the metal layers, contacts, bonding sites, and insulating layers. Capacitance BE 304 includes an equivalent capacitor C1. Capacitor C1 is connected to capacitance DL 302, capacitance FE 306 and ground.

Capacitance FE 306 includes the total capacitance of the Front End (FE) of line of the circuit 101 shown in FIG. 1B. Capacitance FE 306 includes at least the equivalent capacitances of each of the individual components in circuit 101. Capacitance FE 306 includes NMOS transistor N1 and PMOS transistor P10. The gates of each NMOS transistor N1 and PMOS transistor P10 are connected to capacitance DL 302 and capacitance BE 304. The gate and drain of NMOS transistor N1 are connected. The source of NMOS transistor N1 is connected to ground. The gate and drain of PMOS transistor P10 are connected. The source of PMOS transistor P10 is connected to voltage source VDD.

In one or more embodiments, the value of capacitance $C_T$ is sufficient to provide a timing signal that accounts for weak bit timing and either avoids or minimizes the desire for an additional logic delay. A weak bit is a memory cell that, compared with other storage cells, has a relatively low current driving capability due to process/device variations. Weak bit timing refers to the delay time sufficient to guarantee a proper read operation of the weak bit cell. Read timing period τ is a function of the total tracking capacitance $C_T$, where the tracking capacitance of the circuit has a capacitance sufficient to overcome a timing of a weak bit cell of the memory cell array.

In one or more embodiments, the total equivalent capacitance $C_T$ of capacitance unit 300 is utilized to account for and cover for any timing requirements due to weak bits. Therefore, the read timing period τ allows a proper read operation of a memory cell, having a driving current $I_{CELL}$ within a predetermined range, of the memory cell array. For example, the relationship between the read timing delay τ, the driving current of the tracking cell $I_{CELL}$, the equivalent total capacitance $C_T$, and the voltage V to be discharged is Formula 1:

$$\tau = \frac{C_T V}{I_{CELL}} \quad (1)$$

Where τ is the read timing delay, $I_{CELL}$ is the driving current, $C_T$ is the total capacitance, and V is the voltage discharged.

As seen from formula 1, if the driving current of the tracking cell $I_{CELL}$ is n times that of a weak bit cell, the capacitance $C_T$ is increased to provide sufficient read timing delay τ. In some embodiments, the capacitance $C_T$ is set to meet the timing requirements associated with the weak bit cell to account for all possible process variations. As seen from equation 1, the amount of driving current $I_{CELL}$ reduces the amount of read timing delay τ.

Figure 4:
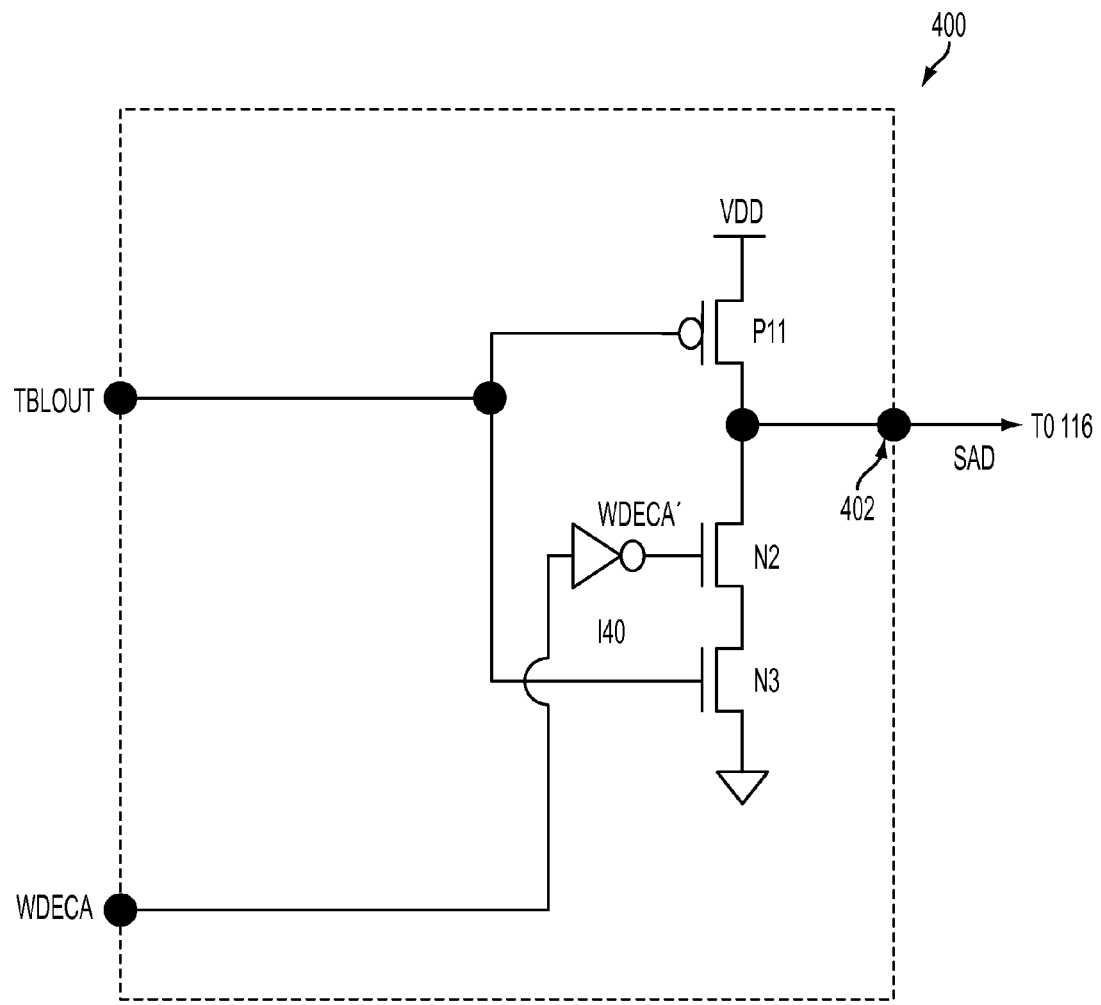
FIG. 4 is a schematic diagram of a detector unit in accordance with one or more embodiments.

FIG. 4 is a schematic diagram of a detection unit 400 in accordance with one or more embodiments. Detection unit 400 is an embodiment of detection unit 114 shown in FIG. 1B. Detection unit 400 is configured to receive control signal WDECA and tracking bitline signal TBLOUT. Detection unit 400 senses the voltage change of the tracking bitline signal TBLOUT and the detection unit 400 is configured to output detection signal SAD to sense amplifier driver 116. Output detection signal SAD indirectly results in sense amplifier SA outputting SAE signal.

Detection unit 400 detects when the voltage of the tracking bitline signal TBLOUT is reduced by a threshold voltage DELTAV. In one or more embodiments, the voltage of the tracking bit line TBLOUT is at a high logical value approximately equal to the voltage source VDD. In this example, as the tracking bit line TBLOUT discharges over a period of time, the detection unit 400 is triggered when the tracking bit line TBLOUT is reduced by threshold voltage DELTAV, resulting in an output from detection unit 400 of a high logical level. The trigger point for detection unit 400 is threshold voltage DELTAV. Detection unit 400 includes PMOS transistor P11, inverter 140, NMOS transistor N2 and NMOS transistor N3. Detection unit 400 allows a greater sensitivity to voltage changes of the voltage source VDD resulting in a more uniform read margin especially for high and low values of operating voltage VDD.

PMOS transistor P11 is configured to receive tracking bitline signal TBLOUT. The gate of PMOS transistor P11 is connected to the gate of NMOS transistor N3. The source of PMOS transistor P11 is connected to voltage source VDD. The drain of PMOS transistor P11 is connected to the drain of NMOS transistor N2 and to output node 402.

NMOS transistor N3 is configured to receive tracking bitline signal TBLOUT. The gate of NMOS transistor N3 is connected to the gate of PMOS transistor P11. The drain of NMOS transistor N3 is connected to the source of NMOS transistor N2. The source of NMOS transistor N3 is connected to ground.

Inverter 140 is configured to receive control signal WDECA and outputs inverted control signal WDECA' to NMOS transistor N2. Inverter 140 controls NMOS transistor N2 to act as a switch.

NMOS transistor N2 is configured to receive inverted control signal WDECA'. The gate of NMOS transistor N2 is connected to inverter 140. The drain of NMOS transistor N2 is connected to the drain of PMOS transistor P11 and to output node 402. The source of NMOS transistor N2 is connected to the drain of NMOS transistor N3. Inverter 140 controls NMOS transistor N2 to act as a switch in an on/off state. In one or more embodiments, when control signal WDECA is a low logical value, then NMOS transistor N2 is in an on state, the output of the detection unit 400 is approximately a low logical value. In one or more embodiments, when control signal WDECA is a high logical value, then NMOS transistor N2 is in an off state, the output of the detection unit 400 changes from a low logical value to a high logical value.

In one or more embodiments, detection unit 400 is an inverter sensing device (not shown) which includes PMOS transistor P11 and NMOS transistor N3. In this example, inverter 140 and NMOS transistor N2 are not included in the inverter sensing device. In one or more embodiments, the inverter sensing device detects when the voltage of the tracking bitline signal TBLOUT is approximately (½)VDD, where VDD is the source voltage, and outputs detection signal SAD. In one or more embodiments, the tripping point for the inverter sensing unit is approximately (½)VDD.

Figure 5:
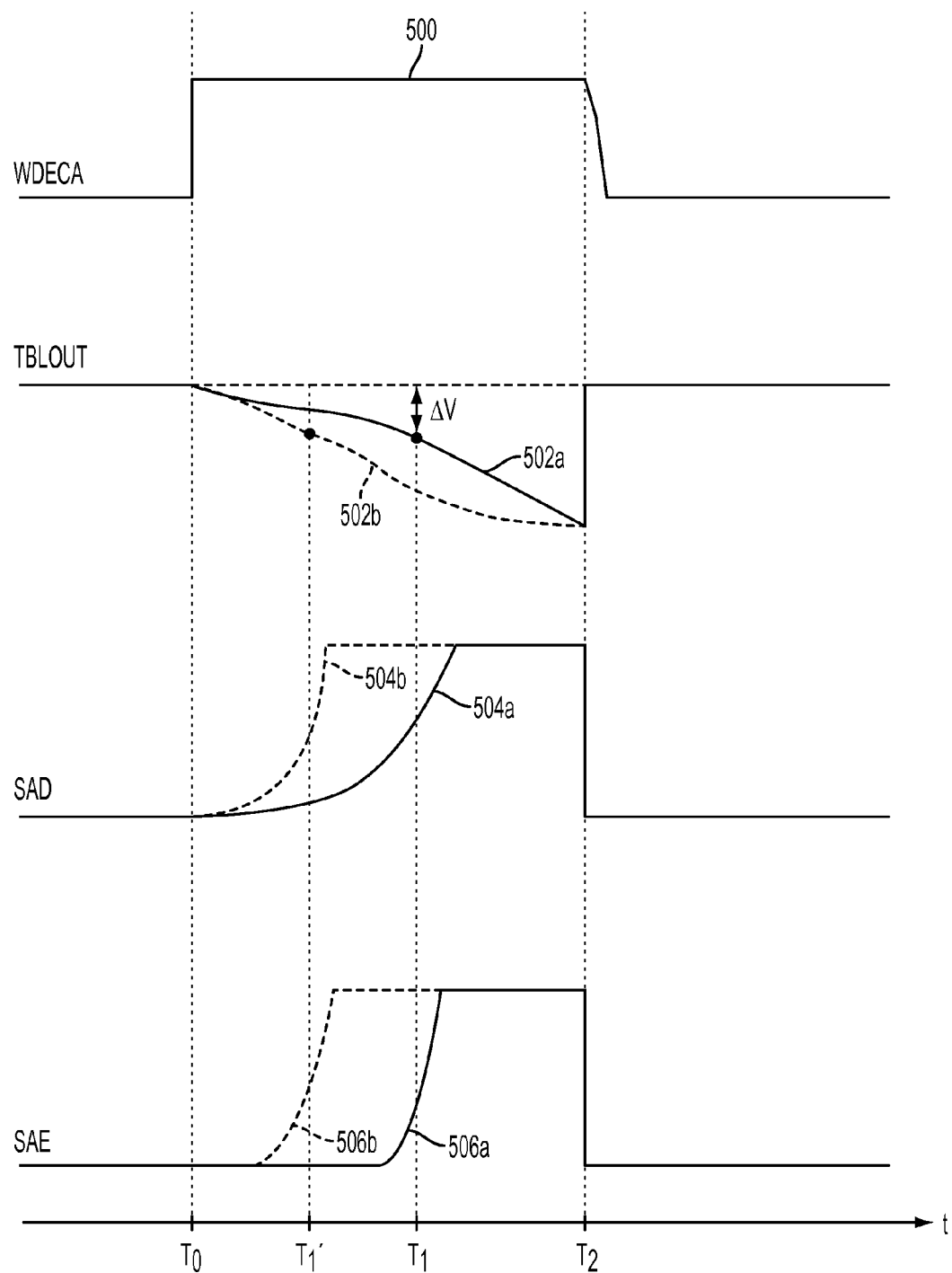
FIG. 5 is a graph of waveforms used to illustrate an operation of the circuit in FIG. 1B, in accordance with one or more embodiments.

FIG. 5 is a chart of timing signals for accessing memory cells in accordance with an embodiment. The timing chart depicts curves of control signal WDECA, tracking bit line signal TBLOUT, detection signal SAD, and sense amplifier driver signal SAE.

As depicted in FIG. 5, the control signal WDECA transitions from low to high at time T0 and returns to low at time T2, as represented by curve 500. After the control signal WDECA is transitions from low to high at time T0, the tracking bit line signal TBLOUT starts to discharge toward a low voltage level (from a higher level approximately voltage source VDD), as represented by curve 502a in FIG. 5.

At time T0, the detection unit 400 receives the control signal WDECA and the tracking bit line signal TBLOUT, and the detection signal SAD as represented by curve 504a is generated. The sense amplifier driver signal SAE signal as represented by curve 506a is generated according to the detection signal SAD 504a.

At time T1, the tracking bit line signal TBLOUT 502a continues discharging and reaches a voltage level that is less than the voltage source VDD by a threshold voltage DELTAV. The detection signal SAD 504a goes from low to high at time T1 when the voltage difference between the tracking bit line signal TBLOUT 502a and the voltage source VDD is greater than a threshold voltage DELTAV. The SAE signal 506a goes from low to high at time T1 when the voltage difference between the tracking bit line signal TBLOUT 502a and the voltage source VDD is greater than a threshold voltage DELTAV. In one or more embodiments, the SAE signal 506a transitions from low to high a small duration of time after time T1, but is still generated when the voltage difference between the tracking bit line signal TBLOUT 502a and the voltage source VDD is greater than a threshold voltage DELTAV.

At time T2, control signal WDECA, tracking bit line signal TBLOUT, detection signal SAD, and sense amplifier driver signal SAE return to the same states prior to T0.

In one or more embodiments, as previously described in FIG. 2, the amount of driving current $I_{CELL}$ generated by tracking unit 200 is changed based upon the number of active switch elements S0, S1, S2 and S3. As the number of active switch elements S0, S1, S2 and S3 is increased, the driving current $I_{CELL}$ increases and results in a tracking bit line TBL which discharges toward a low voltage level at a faster rate.

In at least this example, as depicted in FIG. 5, the control signal WDECA is transitioned from low to high at time T0 and returns to low at time T2, as represented by curve 500. After the control signal WDECA is transitioned from low to high at time T0, the tracking bit line signal TBLOUT starts to discharge toward a low voltage level (from a higher level approximately voltage source VDD), as represented by curve 502b in FIG. 5.

In at least this example, at time T0, the detection unit 400 receives the control signal WDECA and the tracking bit line signal TBLOUT, and the detection signal SAD as represented by curve 504b is generated. The sense amplifier driver signal SAE signal as represented by curve 506b is generated according to the detection signal SAD 504b.

In at least this example, at time T1', the tracking bit line signal TBLOUT 502b continues discharging and reaches a voltage level that is less than the voltage source VDD by a threshold voltage DELTAV. The detection signal SAD 504b goes from low to high at time T1' when the voltage difference between the tracking bit line signal TBLOUT 502b and the voltage source VDD is greater than a threshold voltage DELTAV. The SAE signal 506b goes from low to high at time T1' when the voltage difference between the tracking bit line signal TBLOUT 502b and the voltage source VDD is greater than a threshold voltage DELTAV. In one or more embodiments, the SAE signal 506b transitions from low to high a small duration of time after time T1', but is still generated when the voltage difference between the tracking bit line signal TBLOUT 502b and the voltage source VDD is greater than a threshold voltage DELTAV.

In at least this example, at time T1, tracking bit line signal TBLOUT 502b continues discharging, detection signal SAD 504b is at high logic level, and sense amplifier driver signal SAE 506b is at high logic level.

In at least this example, at time T2, control signal WDECA 500, tracking bit line signal TBLOUT 502b, detection signal SAD 504b, and sense amplifier driver signal SAE 506b return to the same states prior to T0.

In at least this example, time T1' is smaller than time T1, illustrating the use of a higher number of switch elements S0, S1, S2 and S3, reduces the discharge time of the tracking bit line signal TBLOUT, and allows for a more efficient reading of memory cell array 104.

Some embodiments have at least one of the following features and/or advantages. In some embodiments, read margins are stable and sufficient for different predetermined manufacturing process, operational voltage, and temperature (PVT) corners, the threshold voltage DELTAV varies less than 20% for each corner over a range of operating voltages VDD. In one or more embodiments, the threshold voltage DELTAV is about 0.1 volts to 0.45 volts. In one or more embodiments, the threshold voltage DELTAV remains relatively constant over a range of operational voltages VDD ranging from about 0.45 volts to about 1.0 volts. In one or more embodiments, the threshold voltage DELTAV threshold voltage DELTAV is about 0.1 volts to 0.45 volts over a range of operational voltages VDD ranging from about 0.45 volts to about 1.0 volts. In some embodiments, a greater sensitivity to voltage changes of the operational voltage VDD results in a more uniform read margin especially for high and low values of operating voltage VDD. In some embodiments, delay elements used in tracking mechanisms are programmable.

Figure 6:
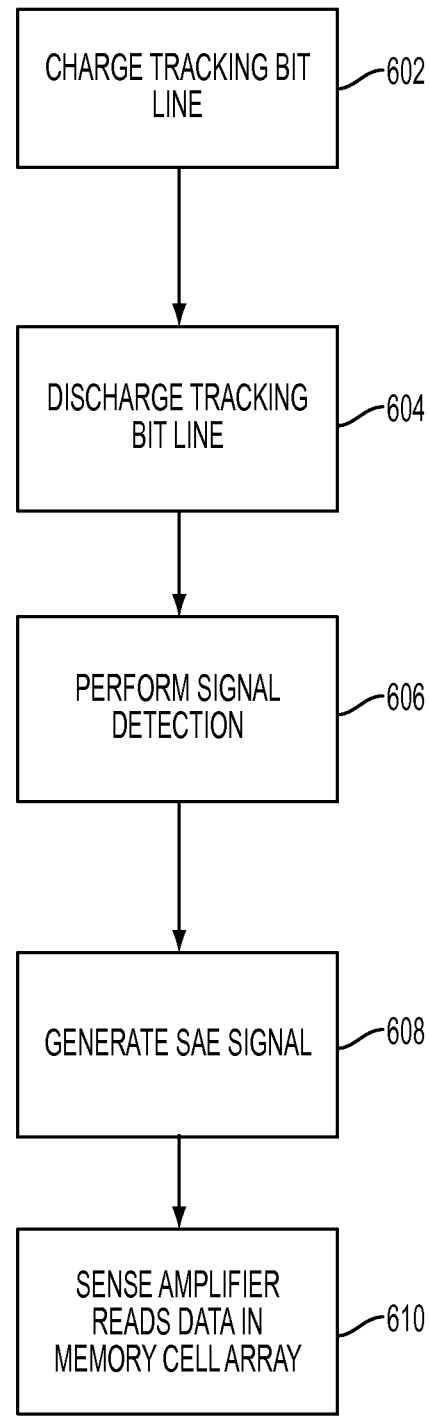
FIG. 6 is a flow chart of a method of operating the circuit shown in FIG. 1B in accordance with one or more embodiments.

FIG. 6 is a flow chart illustrating a method of generating timing signals for accessing memory cells in accordance with one or more embodiments. One of ordinary skill in the art will understand that FIG. 6 includes all of the various embodiments previously disclosed. In one or more embodiments, the flowchart illustrated in FIG. 6 is repeated for each cycle of the clock.

In operation 602, the tracking bit line TBL is charged to a first voltage level, such as a supply voltage level VDD.

In operation 604, in response to a control signal, the voltage of the tracking bit line TBL is discharged from the first voltage level to a second voltage level. In one or more embodiments, the control signal includes at least control signal WDECA. In one or more embodiments, the control signal includes at least control select signals SEL_0, SEL_1, SEL_2 and SEL_3. In one or more embodiments, the first voltage level is greater than the second voltage level.

In operation 606, signal detection of the tracking bit line signal TBLOUT is performed. In one or more embodiments, the signal detection is triggered when the voltage difference between the tracking bit line signal TBLOUT and the voltage source VDD is greater than a threshold voltage DELTAV.

In operation 608, an SAE signal is generated in response to the detected signal. The SAE signal goes from low voltage to a high voltage when the voltage difference between the tracking bit line signal TBLOUT and the voltage source VDD is greater than a threshold voltage DELTAV.

In operation 610, the SAE signal is received and a sense amplifier reads the data in the memory cell array.

In one or more embodiments, the flowchart illustrated in FIG. 6 is repeated for each cycle of the clock.

One aspect of this description relates to a circuit includes a tracking bit line, a tracking unit connected to the tracking bit line and a detection unit. The tracking unit is configured to receive a first control signal, and configured to selectively charge or discharge a voltage on the tracking bit line in response to the first control signal. The detection unit is coupled to the tracking bit line and configured to generate a sense amplifier enable (SAE) signal in response to the voltage level on the tracking bit line.

Another aspect of this description relates to a circuit including at least one column of memory storage cells, a read/write circuitry coupled to the memory storage cells to access the memory storage cells, the read/write circuitry comprising a sense amplifier configured to read data of the memory storage cells upon receipt of a sense amplifier enable (SAE) signal, and a timing unit configured to generate the SAE signal in response to a first control signal. The timing unit comprising a tracking bit line, a tracking unit connected to the tracking bit line, configured to selectively charge or discharge a voltage on the tracking bit line in response to a first control signal, and a detection unit coupled to the tracking bit line and configured to generate the SAE signal in response to the voltage level on the tracking bit line.

Still another aspect of this description relates to a method of generating a sense amplifier enable (SAE) signal for a memory circuit in response to a first control signal, the memory circuit being configured to have a proper read functionality a predetermined time delay after receipt of the first control signal. The method including generating a tracking signal by a tracking unit in response to the first control signal by selectively charging or discharging a voltage of a tracking bit line, and detecting the voltage of the tracking bit line and generating the SAE signal according to the voltage of the tracking signal. Aspects of this method include charging the tracking bit line to a first voltage level, discharging the voltage of the first tracking bit line from the first voltage level to a second voltage level after receipt of the control signal and generating the SAE signal after the voltage of the first tracking bit line is less than the second voltage level. Still another aspect of this method includes adjusting the timing delay of the memory circuit by adjusting the rate of discharge of the voltage on the tracking bit line.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A circuit comprising:
   a tracking bit line;
   a tracking unit coupled to the tracking bit line, wherein the tracking unit is:
      configured to receive a first control signal and a second control signal, and
      configured to selectively charge or discharge a voltage on the tracking bit line in response to the first control signal and the second control signal; and
   a detection unit coupled to the tracking bit line and configured to receive the first control signal, generate an inverted first control signal responsive to the first control signal, and to generate a sense amplifier enable (SAE) signal in response to a voltage level on the tracking bit line and the inverted first control signal.

2. The circuit of claim 1, wherein a rate of discharge of the voltage on the tracking bit line is controllable by the second control signal.

3. The circuit of claim 1, wherein a rate of discharge of the voltage on the tracking bit line is proportional to an amount of current on the tracking bit line.

4. The circuit of claim 3, wherein the rate of discharge of the voltage on the tracking bit line increases as the amount of current on the tracking bit line increases.

5. The circuit of claim 2, wherein the rate of discharge of the voltage on the tracking bit line is proportional to a timing delay of the tracking unit.

6. The circuit of claim 5, wherein the timing delay of the tracking unit is proportional to a capacitance of the tracking unit.

7. The circuit of claim 6, wherein the capacitance of the tracking unit comprises:
   a data line capacitance value; and
   a bit line capacitance value.

8. The circuit of claim 1, wherein the detection unit is configured to generate the SAE signal at a time delay after the first control signal is received.

9. The circuit of claim 1, wherein the tracking unit and the tracking bit line are included in a Synchronous Random Access Memory (SRAM).

10. A circuit comprising:
    at least one column of memory storage cells;
    a read/write circuitry coupled to the memory storage cells to access the memory storage cells, the read/write circuitry comprising a sense amplifier configured to read data of the memory storage cells upon receipt of a sense amplifier enable (SAE) signal; and
    a timing unit configured to generate the SAE signal in response to a first control signal, the timing unit comprising:

a tracking bit line;

a tracking unit coupled to the tracking bit line, configured to selectively charge or discharge a voltage on the tracking bit line in response to the first control signal; and a detection unit coupled to the tracking bit line and configured to receive the first control signal, generate an inverted first control signal responsive to the first control signal, and to generate the SAE signal in response to a voltage level on the tracking bit line and the inverted first control signal.

11. The circuit of claim 10, wherein the detection unit is configured to detect a voltage difference on the tracking bit line.

12. The circuit of claim 10, wherein the detection unit comprises:

a first P-type transistor and a first N-type transistor coupled in series;

a first terminal of the first P-type transistor coupled with a first terminal of the first N-type transistor and configured as a first input node coupled with the tracking bit line;

a second terminal of the first P-type transistor configured as an output node; and the detection unit configured to generate the SAE signal on the output node in response to at least the voltage level on the first input node.

13. The circuit of claim 12, further comprising:

a second N-type transistor;

a first terminal of the second N-type transistor configured to receive the inverted first control signal;

a second terminal of the second N-type transistor coupled with the second terminal of the first P-type transistor; and a third terminal of the second N-type transistor coupled with a second terminal of the first N-type transistor.

14. The circuit of claim 13, further comprising:

an inverter;

a first terminal of the inverter coupled to a second input node of the detection unit, and configured to receive the first control signal;

a second terminal of the inverter coupled to the first terminal of the second N-type transistor; and the detection unit configured to generate the SAE signal on the output node in response to the first control signal on the second input node of the detection unit.

15. The circuit of claim 12, wherein the first terminal of the first P-type transistor is a gate terminal of the first P-type transistor and the first terminal of the first N-type transistor is a gate terminal of the first N-type transistor.

16. The circuit of claim 13, wherein the detection unit is configured to detect a voltage difference on the tracking bit line.

17. The circuit of claim 11, wherein the voltage difference on the tracking bit line is a difference between a source voltage and a threshold voltage.

18. A method of generating a sense amplifier enable (SAE) signal for a memory circuit in response to a first control signal and a second control signal, the memory circuit being configured to have a read functionality a predetermined time delay after receipt of the first control signal, the method comprising:

generating a tracking signal by a tracking unit in response to the first control signal and the second control signal by selectively charging or discharging a voltage of a tracking bit line;

detecting the voltage of the tracking bit line;

receiving, by a detection circuit the first control signal, and generating an inverted first control signal responsive to the first control signal; and generating the SAE signal according to the voltage of the tracking bit line and the inverted first control signal.

19. The method of claim 18, further comprising:

charging the voltage of the tracking bit line to a first voltage level;

discharging the voltage of the tracking bit line from the first voltage level to a second voltage level after receipt of the first control signal and the second control signal; and generating the SAE signal after the voltage of the tracking bit line is less than the second voltage level.

20. The method of claim 18, further comprising:

adjusting the predetermined time delay of the memory circuit by adjusting a rate of discharge of the voltage on the tracking bit line.

* * * * *